United States Patent [19]

Denecke

[11] 4,328,484
[45] May 4, 1982

[54] METHOD AND APPARATUS FOR NUMERICALLY CONVERTING A PARALLEL BINARY CODED NUMBER FROM A FIRST UNIT SYSTEM TO A SECOND UNIT SYSTEM

[76] Inventor: Henry M. Denecke, 629 W. Knoll Dr., Los Angeles, Calif. 90069

[21] Appl. No.: 183,196

[22] Filed: Sep. 2, 1980

[51] Int. Cl.³ .............................................. H03K 13/24
[52] U.S. Cl. ........................ 340/347 DD; 235/92 MP; 235/92 VA
[58] Field of Search .................. 235/310, 311, 92 VA, 235/92 MP, 92 PE; 340/347 DD

[56] References Cited

U.S. PATENT DOCUMENTS

| | | | |
|---|---|---|---|
| 2,697,549 | 12/1954 | Hobbs | 235/92 VA |
| 3,140,469 | 7/1964 | Hart | 340/347 DD |
| 3,276,013 | 9/1966 | Chandler | 340/347 DD |
| 3,560,959 | 2/1971 | Bergey | 340/347 DD |
| 3,748,450 | 7/1973 | Fico | 340/347 DD |
| 3,805,041 | 4/1974 | Langheinrich | 340/347 DD |
| 3,862,407 | 1/1975 | Baldauf | 340/347 DD |
| 3,885,134 | 5/1975 | Bergin | 340/347 DD |
| 4,011,559 | 3/1977 | Sharp | 340/347 DD |
| 4,021,828 | 5/1977 | Iura | 235/92 MP |

Primary Examiner—Charles D. Miller
Attorney, Agent, or Firm—I. Morley Drucker

[57] ABSTRACT

A method and apparatus are disclosed for converting a parallel binary coded, input number from a first unit system to a second unit system, the two unit systems being related by a known numerical conversion factor. The parallel binary coded input number is converted to a number of serial pulses equal to the coded number and the serial pulses are fed to a counter provided with feedback. The feedback operates on the counter to reduce the count of serial pulses by a selected numerical conversion factor to thereby effect the desired conversion.

The counter output typically includes a converted number expressed in the second unit system and a remainder number expressed in the first unit system, the remainder being smaller than the numerical conversion factor.

The described embodiment of the invention is a digital electronic counter useful with motion picture film transport equipment for converting the number of film frames displaced by the transport into a variety of output formats such as film footage or running time of the film.

11 Claims, 3 Drawing Figures

METHOD AND APPARATUS FOR NUMERICALLY CONVERTING A PARALLEL BINARY CODED NUMBER FROM A FIRST UNIT SYSTEM TO A SECOND UNIT SYSTEM

BACKGROUND OF THE INVENTION

1. Field of the Invention

The invention relates generally to digital electronic counter systems and more particularly to digital counters for converting a parallel binary coded input number from a first unit system to a second unit system.

2. Description of the Prior Art

Various digital electronic counters capable of effecting numerical conversions are known. However, applicant is not aware of any apparatus or method similar to those described and claimed herein.

SUMMARY OF THE INVENTION

This invention is a numerical converter electronic system and method of operation of the same. The numerical converter is described as part of a novel film footage counter but is not limited to such use.

More specifically, this invention is a method and apparatus for numerically converting a parallel binary coded input number representative of a first unit system to a second equivalent number representative of a second unit system, said first unit system being related to said second unit system by a given numerical conversion factor.

The conversion is carried out by first converting the parallel binary coded input number to an equal number of serial pulses which are then fed to the input of a counter means. The counter means comprises at least two sets of cascaded counter stages, each set having a binary word output.

The first set of cascaded counter stages counts the serial pulses under feedback control. The feedback means decodes the word output of the first counter set and resets it to zero when the counter's binary word output is equal to the known numerical conversion factor. A carry pulse is generated by the feedback controlled first counter set and fed to the input of the second set of cascaded counter stages each time that the output of the first counter set reaches the known numerical conversion factor. Thus, the first counter set counts up to the numerical conversion factor an integral number of times, each time feeding a carry pulse to the second counter set and resetting to zero. The binary word output of the second counter set is equal to the total number of carry pulses, i.e., the number of serial pulses divided or reduced by the numerical conversion factor. The output of the first set represents a remainder number of serial pulses.

The apparatus of the invention may be briefly described as comprising:

means for generating a number of serial digital pulses equal to a parallel binary coded input number;

counter means receiving the serial digital pulses as an input; and feedback means operative on said counter means for deriving a counter output comprising a converted integer number equal to said number of serial digital pulses divided by the numerical conversion factor and an unconverted remainder number of serial digital pulses. The remainder number is smaller than the numerical conversion factor.

The preferred means for generating the serial output pulses comprise rate multiplier means driven by a clock means and having rate select inputs accepting the parallel binary coded input number. The rate multipliers are cascaded in the add mode such that each cycle, of the cascaded rate multiplier chain comprises an output of a number of serial output pulses equal to the parallel binary coded input followed by an inhibit pulse output.

The feedback means comprise logic gate means operatively connected to the binary coded word output of the first counter set. The output of the first counter set is decoded by the logic gate means for generating a carry pulse when the decoded counter output equals a given numerical conversion factor. The carry pulse is fed to (a) the input of the second counter set and (b) is also fed back to the reset input of the first counter set. Upon reaching a count equal to the known or given conversion factor the first counter set is reset to zero by the carry pulse and then continues to count up succeeding serial pulses. This process continues until all serial pulses generated in one output cycle of the rate multiplier means are counted by the first counter set, at which time the output of the second counter set will show the total count of the carry pulses (each carry pulse being equivalent to one unit of second unit systems), and the output of the first counter set will show a remainder count of serial pulses which is representative of units of the first unit system, i.e., the unconverted units of the coded input number.

The method of this invention may be briefly described as comprising the steps of:

converting said parallel binary coded number into a number of serial digital pulses equal to said coded number;

counting the serial pulses;

generating a carry pulse when the serial pulse count is equal to a given numerical conversion factor; and counting the carry pulses to compute a converted integer output number, which output number also includes a converted remainder count of said serial pulse count insufficient to generate a carry pulse. Thus the remainder number of count is smaller than the numerical conversion factor.

The invention is embodied in an electronic digital counter for converting the number of film frames displaced by a film transport mechanism to a selected one of several output formats. Each output format is related to the number of film frames by a known numerical conversion factor. Briefly, the converting counter comprises:

encoder-decoder means for deriving digital pulses indicative of film displacement by the film transport, each pulse being representative of the displacement of one frame of film; and a master counter means receives as an input the digital pulses indicative of film displacement by said transport and derives a parallel binary coded number indicative of the total number of frames displaced by said transport.

The binary word output of the master counter means is operatively connected to rate multiplier means having rate select inputs receiving as an input the parallel binary coded number. The rate multiplier means generate a number of serial output digital pulses equal to the parallel binary coded input number. A clock means drives the rate multiplier means. A slave counter means receives the serial output digital pulses as an input, and feedback means operate on the slave counter means for subtracting said numerical conversion factor from the serial pulse count of said slave counter and counting the total number of said subtractions. The output count of the slave counter comprises an unconverted remainder number 6 indicative of film frames, this remainder number being lesser than the selected numerical conversion factor.

Many other conversion applications of this invention will come to mind. One example is the conversion of a binary coded hexadecimal input number to a binary coded decimal output number. In this application the rate multipliers are preferably of the binary type adapted to accept a hexadecimal input at the rate select inputs. The hexadecimal input number is thus converted to a number of serial digital pulses equal to the hexadecimal coded input number. The serial digital pulses are fed to the input of counter means having Binary Coded Decimal (BCD) outputs. Suitable Binary Coded Decimal type digital counters are commercially available as standard packages. These include internal feedback means which decode a "nine" (9) output and then reset the counter, providing also a carry pulse output. The output of the BCD counters is the converted binary coded decimal equivalent of the hexadecimal coded input. No remainder is produced in this particular application because the conversion is between pure number systems as opposed to unit systems of physical measurement.

It will be apparent from the foregoing that an input number encoded in any base-a binary code may be converted to its equivalent number in any base-b binary code by generating a number of serial digital pulses equal to said base-a binary encoded input number and then counting the serial digital pulses in the bas b binary numerical system. This latter counting function is carried out with appropriate digital counter means.

DETAILED DESCRIPTION OF THE INVENTION

The embodiment of the invention described below is a electronic digital counter for use with motion picture film transport mechanisms, such as film editing tables.

In the editing process a motion picture film track is moved forward and backwards from a start mark for viewing on a projection screen. This back and forth movement may take place, for example, during the matching and mixing of separately recorded sound track. It is often necessary to measure the length of a given segment of film and presently available editing tables are equipped with footage counters for this purpose, but lacking the flexible output format capability of this invention.

The length of motion picture film can be measured in one of several related standard formats or unit systems. Thus, film length can be expressed in terms of (a) total film frames; (b) feet and frames; or (c) running time at standard sound speeds.

The most basic unit and the common denominator to all such standard formats is the film frame unit. The standard footage formats are 16 frames per foot for 35 mm film, and 40 frames per foot for 16 mm film. The standard sound speed formats are 24 frames per second and 30 frames per second in the United States, and 25 frames per second in Europe. A given number of film frames can then be expressed in terms of minutes and seconds of running time at a standard sound speed, or as a number feet of film.

A counter capable of effecting such conversion to a selected format is a highly valuable addition to a film transport system. The converting counter described below also features continuous updating of the converted output number to follow a continuously changing input number.

Figure 1:
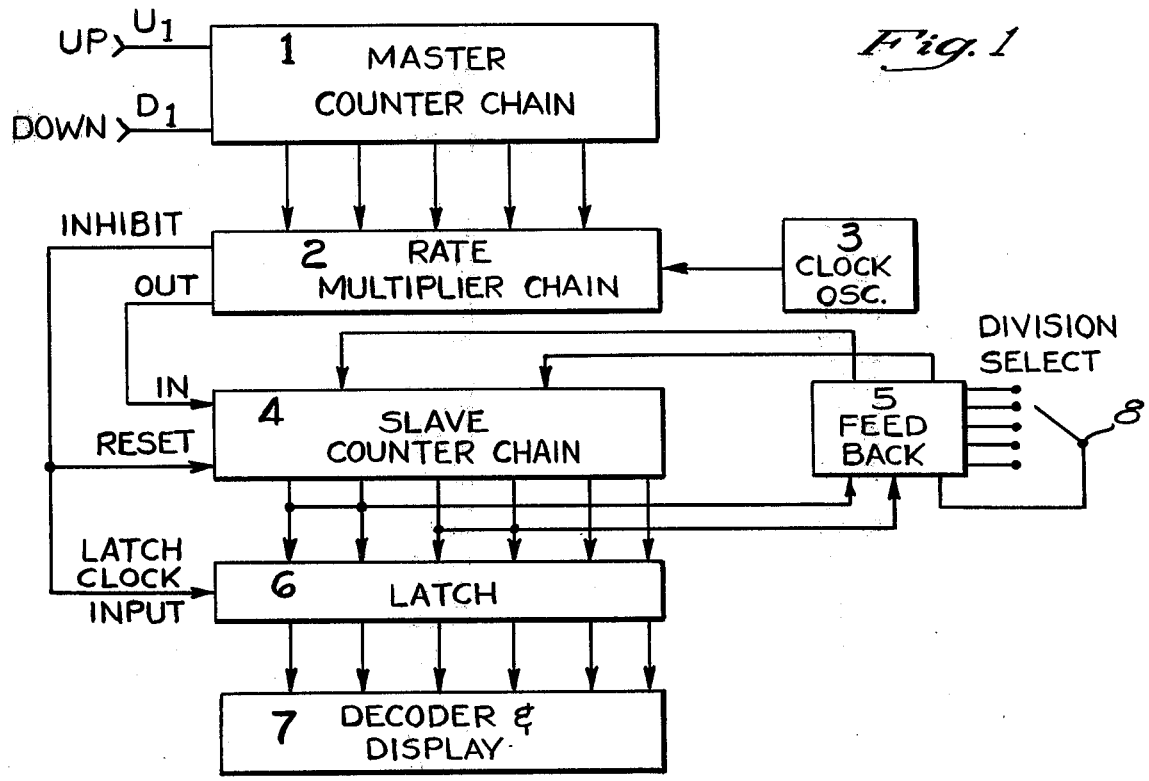
FIG. 1 is a block diagram of a converting digital electronic counter including the numerical conversion system of this invention.

For ease of understanding and with particular reference to FIG. 1 of the drawings, the converting film counter system may be divided into three sections:

(A) THE MASTER COUNTER OR FRONT END

The master counter means or chain, block 1 in FIG. 1, receives digital up pulses or down pulses as a input indicative of film movement by the film transport in one direction or its opposite, respectively. The up/down pulse trains are derived from conventional encoder/decoder means not shown in the drawings. Preferably, the decoder output is such that each pulse is indicative of the displacement of one frame of film by the transport mechanism.

Figure 3:
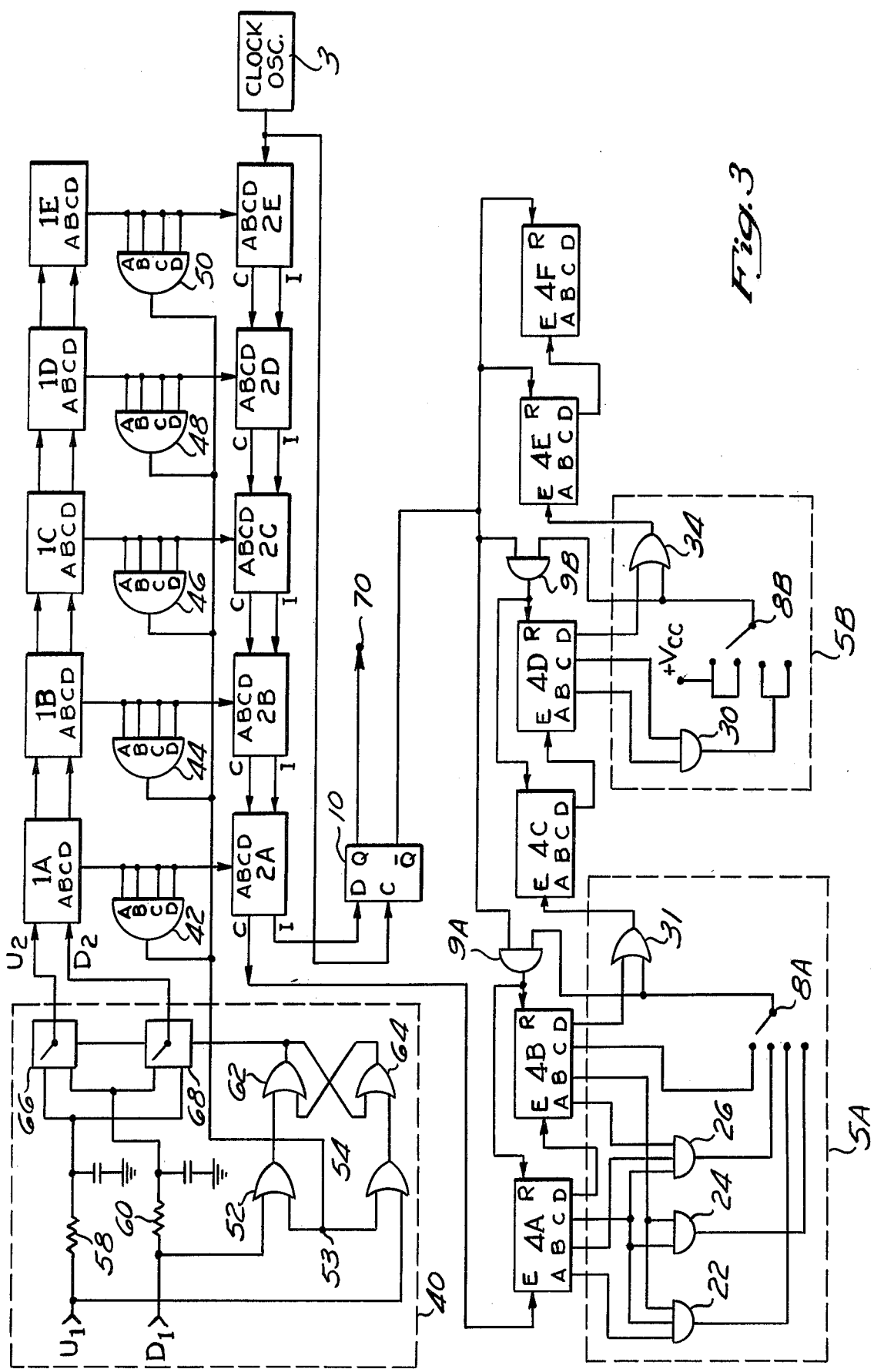
FIG. 3 is a circuit diagram of the converting counter of FIG. 1.

As shown in FIG. 3, the master counter comprises five cascaded up/down counter stages 1A-IE, each stage having a parallel coded binary word output ABCD. The output of the master counter chain thus comprises a five digit parallel binary coded number representative of the net total number of film frames displaced by the film transport mechanism. The master counter output follows the film movement at all times as up/down pulses are added or subtracted from the contents of the counter. The film displacement is measured from an arbitrary starting point on the film track at which the master counter was reset to a zero output count. The master counter operates both in the up and the down mode to continuously compute the net film movement by adding the substracting pulses and outputting a nearly instantaneous frame count from the starting or zero point.

The input to the master counter means also comprises a digitally controlled direction sensing switch receiving the up/down pulses derived from the encoder/decoder means and feeding the up/down inputs of the master counter. The purpose and operation of this direction sensing switch is described separately in section (D) below.

The master counter chain and associated input devices function as a "front end" for the numerical converter section which is the heart of this invention. The essential function of this front end is to receive a input and to present it to the numerical converter section as a parallel binary coded input number. For other converter applications a different front end adapted to the particular use may be substituted.

(B) THE NUMERICAL CONVERTER OF THIS INVENTION

The numerical converter section comprises rate multiplier means, clock means driving the rate multiplier means, slave counter means, and feedback means, shown as blocks 2, 3, 4 and 5, respectively, in FIG. 1.

The operation of rate multipliers is described in the 1977 RCA COS/MOS Integrated Circuits Databook at pages 287-291 for binary coded decimal (BCD) type devices, and also in the 1977 National Semiconductor CMOS Databook at pages 2-177 to 2-183 for both binary and BCD type devices, both of these references being incorporated by this reference as though fully set out herein.

Figure 2:
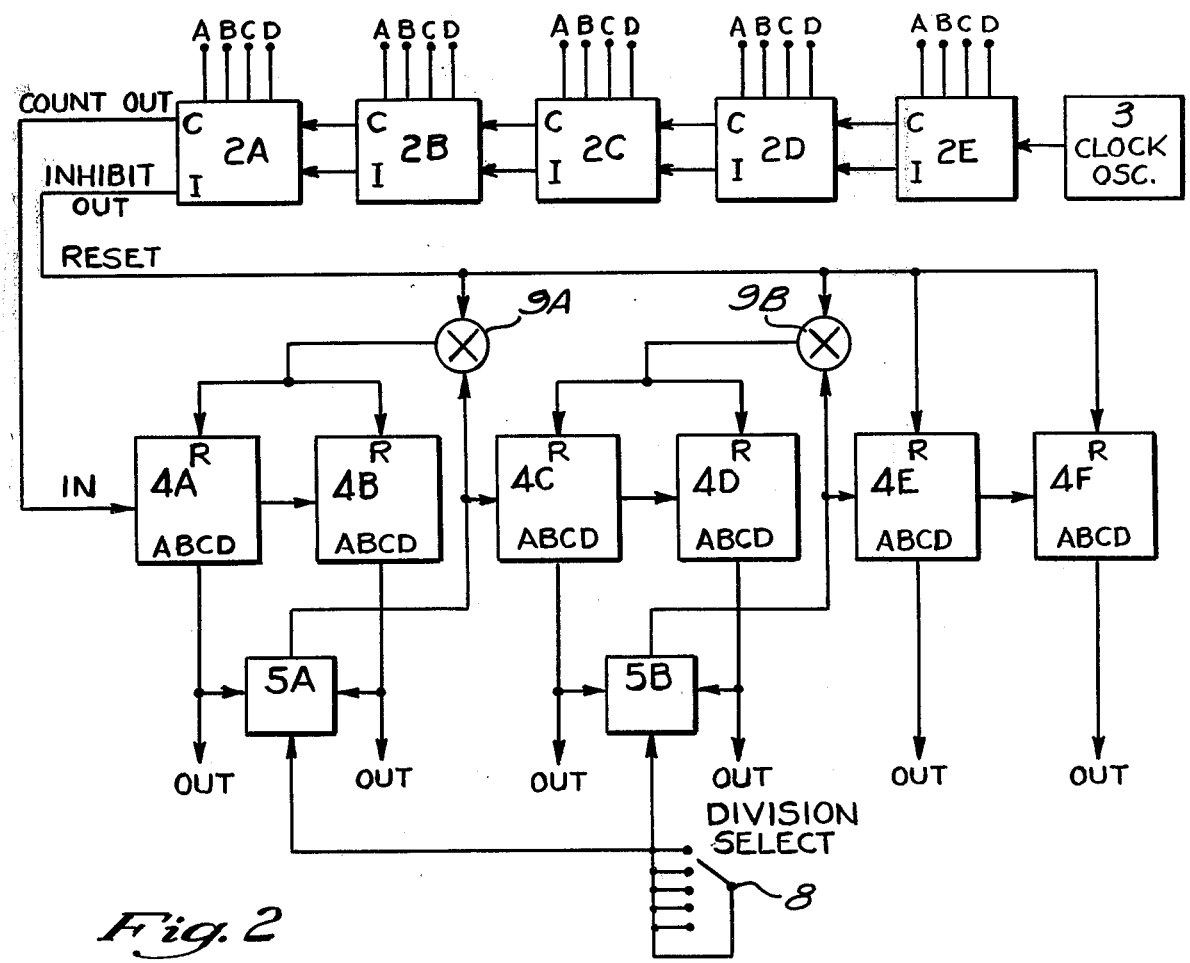
FIG. 2 is a more detailed block diagram of the numerical conversion system of this invention.

FIG. 2 is a block diagram of the numerical converter of this invention. As shown there, the rate multiplier means or chain comprises five rate multipliers 2A-2E cascaded in the add mode. Each of the five rate multiplier devices 2A-2E has rate select inputs ABCD adapted to receive a parallel binary coded word. The rate multiplier chain is continuously driven by a clock means or oscillator 3 which oscillates at approximately 500 kilohertz, the precise frequency being non-critical.

The rate multipliers 2A-2E operate in continuous cycles, each cycle comprising an output of a number of serial pulses equal to the coded input number at the rate select inputs ABCD, followed by a inhibit pulse output at output I of rate multiplier 2A. The inhibit pulse indicates completion of the serial pulse output.

The total number of serial output pulses generated by the rate multiplier chain or means appearing at the rate or count output C of rate multiplier 2A is equal to the 5 digit parallel binary coded number present at the rate select inputs RS of the rate multiplier chain. The rate select inputs ABCD of device 2A represent the most significant digit, and the rate select inputs ABCD of device 2E represent the least significant digit of the parallel binary coded input number derived by the master counter chain 1A-1E.

The serial pulse output of the rate multiplier means is fed to the input of a counter means or slave counter chain comprising three counter sets, 4A-4B; 4C-4D; and 4E-4F, respectively, each counter set including two cascaded counter stages.

The first counter set comprising cascaded counters 4A and 4B is under the control of feedback means 5A. The feedback means 5A operate to decode the binary word output ABCD of counters 4A-4B and to generate a carry pulse output when the binary word output of the first counter set is equal to a selected numerical conversion factor.

The feedback means 5A comprise logic gate means or AND gates 22, 24 and 26 connected to the ABCD word outputs of counter stages 4A-4B of the first counter set for decoding a plurality of numerical conversion factors. Specifically, the inputs of the three input AND gate 22 are connected to binary output B of counter stage 4B and to binary outputs A and C of counter stage 4A. The output of AND gate 22 will be high, i.e., a carry pulse is generated, if and only if the word output of the first counter set 4A-4B is equal to the numerical conversion factor 25. Similarly AND gate 24 is connected for decoding a word output of 24, while AND gate 36 decodes a word output of 16. Finally, a word output of 40 is decoded by a direct connection 28 of the C output of counter stage 4B. That is, each of the AND logic gate means 22, 24, 26 has inputs connected to a particular combination of the preferably binary coded decimal (BCD) outputs ABCD of counters 4A, 4B such that the particular combination adds up to a desired numerical conversion factor. Gate 22 is connected to decode a binary coded output equal to 25, this being the conversion factor for deriving an output format of seconds of running time at a sound speed of 25 frames/second. Gate 24 decodes an output equal to 24, and generates carry pulses indicative of running time in seconds at a sound speed of 24 frames/second. Gate 26 decodes an output of 16 for generating carry pulses indicative of feet of 35 mm film track. Finally, connection 28 decodes a 40 output, for converting frames to feet of 16 mm film track. Logic gate means is defined to include direct connections such as 28.

Switch means 8A is provided for selecting one of the decoded word outputs. The selected carry pulse output of feedback means 5A is fed to the input of the second counter set 4C-4D via OR gate 31 and is also fed back to the reset or clear inputs R of counter stages 4A-4B via mixer means or AND gate 9A. The first counter set 4A-4B is therefore reset or cleared by the carry pulse output of the feedback means 5A before the next following serial pulse is counted by stage 4A.

The first counter set 4A-4B thus counts up to the selected numerical conversion factor, a carry pulse is fed to the following counter set 4C-4D, and the first counter set 4A-4B is cleared or reset to zero. In effect then, the numerical conversion factor is repeatedly subtracted from the serial pulse count of the first counter set 4A-4B and each carry pulse is indicative of one such subtraction. This count sequence of the first counter set is repeated an integral number of times until the serial digital pulse train input to the counter means 4 ceases, upon completion of the rate multiplier means output cycle. At the end of this cycle the output of the second counter set 4C-4D is a converted integer number equal to the total count of the carry pulses generated by the feedback means 5A during one output cycle of the rate multiplier means 2A-2E. The output of the first counter set 4A-4B is a unconverted remainder count of serial pulses too small to generate a carry pulse. This remainder count is always lesser than the selected numerical conversion factor.

Where the parallel coded input number is being converted to a unit system having greater and lesser units (e.g., a running time output format comprising minutes and seconds) the slave counter chain comprises additional feedback means 5B for effecting a second conversion from the lesser units to the greater units, the two being related by a second conversion factor intrinsic to the second unit system.

Thus in converting film frames to running time it is desirable to derive a converted output number comprising at least seconds (the lesser units) and minutes (the greater units). (An output of hours is optional and would require additional counter stages and feedback means.)

The time format conversion requires a second, internal conversion factor of 60, i.e., the number of seconds in one minute. For this purpose a third counter set 4E-4F is included in the slave counter chain 4A-4F and the second feedback means 5B in FIGS. 2 and 3.

The operation of the secondary feedback means 5B is similar to that of feedback means 5A already described. The binary word output ABCD of the second counter set 4C-4D is decoded by logic gate means 30 for the selected secondary intrinsic conversion factor, e.g., 60, and a secondary carry pulse output is generated by the second feedback means 5B and fed to the third counter set 4E-4F. The third counter set 4E-4F thus counts one secondary carry pulse for every sixty initial carry pulses counted by the second counter set 4C-4D. The secondary carry pulses are also fed back through AND gate or mixer means 9B to the reset inputs of counter stages 4C and 4D for clearing or resetting the second counter set 4C-4D to zero every time the count reaches sixty. This count sequence is repeated an integral number of times until no more carry pulses are fed by feedback means 5A to the counter stage 4C. At the end of one output cycle of rate multiplier means 2A-2E the output of third counter set 4E-4F will indicate a number of minutes, while the output of the second counter set 4C-4D will indicate a remainder number of seconds, which remainder number is always less than the selected secondary conversion factor, i.e., sixty. The output of the first counter set 4A-4B will be representative of a remainder count or number of frames, this remainder number in turn being lesser than the numerical conversion factor from frames to seconds (either 24, 25 or 30 frames/second, depending on the standard sound speed selected). Switch means 8B is provided for selecting either the output of gate 30, for time format conversions, or for directly cascading the second and third counter sets 4C-4D and 4E-4F for footage format conversions. The footage output format thus includes four digits indicative of feet of film track (i.e., the outputs of counter stages 4C, 4D, 4E and 4F), and a two digit remainder count indicative of film frames. The time output format comprises two digits each of frames, seconds, and minutes, at the outputs of counters 4A-4B, 4C-4D, and 4E-4F, respectively.

The inhibit pulse output of the rate multiplier means 2A-2E derived at output I of rate multiplier 2A is fed via mixer means 9A and 9B to the reset inputs R of every counter stage in the slave counter chain 4A-4F as a total reset pulse to clear the slave counter means and to reset all binary word outputs ABCD of counter stages 4A-4F to zero. The slave counter chain 4A-4F is then ready to receive the serial pulse output of the following rate multiplier output cycle for another conversion cycle or update.

The rate multiplier chain is cycled in the above-described sequence continuously by a sustained pulse input from the clock means or clock oscillator 3. A chain of five rate multipliers driven by a 500 kilohertz oscillator cycles at a rate of 5 cycles per second. This is to say that the serial pulse output of the rate multiplier means is updated five times per second, yielding a similar conversion update rate at the ABCD word outputs of the slave counter chain 4A-4F. A higher clock rate, of course, produces a faster update rate.

This fast update rate is desirable since any film movement is immediately fed to the up/down inputs of the master counter chain. The frame count of the master counter follows the movement of film even as the film track is being rewound at high speed or is in slow forward movement. The ABCD outputs of the master counter 1A-1E feeding into the ABCD rate select inputs of the rate multiplier means 2A-2E is therefore a continuously changing number indicative of the nearly instantaneous net frame count from some initial starting point. The parallel binary coded input number to the rate multiplier means 2A-2E likewise is indicative of this nearly instaneous frame count. With a rate multiplier means cycle time of 0.2 seconds, the output number of the slave counter chain 4A-4F is thus updated five times per second. In practice therefore the converted counter output of this invention follows the movement of film at a rate of 5 update counts per second.

It is also possible to select an unconverted output format consisting of the net total frame count derived by the master counter 1A-1E. This is done by disabling the feedback means 5A and 5B and directly cascading all counter stages 4A through 4F. The resulting slave counter 4A-4F output is an actual count of the serial pulse output of the rate multiplier means 2A-2E, which is in turn equal to the net frame count or parallel binary coded input number to the ABCD rate select inputs.

(C) THE OUTPUT DIGITAL DISPLAY

The digital display section comprises conventional latch means 6 shown in FIG. 1 for latching the binary word output of the slave counter, and preferably comprises decoder and numerical display means 7, such as seven segment L.E.D.'s including suitable display drivers for decoding the latched binary word output and for visually displaying the latched counter output.

The ABCD word output of slave counter stages 4A-4F is latched by the Inhibit pulse output at the end of each output cycle of the rate multiplier means 2A-2E. Where the counter stages 4A-4F are cascaded asynchronously, as in FIG. 3, a ripple delay is introduced into the counter chain which necessitates delaying both the resetting of the counter chain by the Inhibit output pulse and also the clocking of the latch means by the same Inhibit pulse to avoid latching invalid data, i.e., before the counter chain has completed the count of all serial pulses and carry pulses.

The D flip-flop 10 receives the Inhibit pulse output and synchronizes the Inhibit pulses to the clock means 3. This removes any spurious noise spikes generated by the rate multipliers and also introduces the necessary delay of the Inhibit pulse output with respect to the serial pulse output.

The D flip-flop 10 receives the Inhibit pulses at its D input and the clock pulses are fed to the C input.

The $\overline{Q}$ output of the flip-flop supplies the total reset pulses to the reset inputs R of counter stages 4A-4F for totally clearing or resetting the slave counter means 4A-4F upon completion of each conversion cycle.

The reset inputs R of stages 4A-4B and 4C-4D are fed by the outputs of mixer means or AND gates 9A and 9B respectively. The function of the mixer means 9A and 9B is to feed both the feedback derived reset pulses selected by switch means 8A and 8B respectively, and the Inhibit pulses for clearing the slave counter means. No mixing of reset pulses is necessary for the third counter set comprising cascaded counter stages 4E-4F since these stages are not under control of feedback means.

The Q output of the D flip-flop 10 is connected at point 70 to the clock input of the latch means shown as block 6 in FIG. 1 but not shown in FIG. 3 for the sake of clarity.

The data at outputs ABCD of counter stages 4A-4F is latched by the Q output of the D flip-flop 10. Although the Q and $\overline{Q}$ outputs are simultaneous, there is no loss of data because of an inherent delay in clearing the counters 4A-4F, while there is no delay in latching the data in the latch means 6.

(D) DIGITALLY CONTROLLED INPUT SWITCH

The dotted line box 40 in FIG. 3 encloses a electronic double pole double throw switch. This circuitry prevents the up/down master counter chain 1A-1E from counting below a zero count (e.g., 00000, 99999, 99998, etc.) which yields non useful outputs in film applications. Switch 40 reverses the $U_1$, $D_1$ inputs to the master counter 1A-1E upon reaching a zero output count, causing the master counter to count up from zero. The switch 40 may also be provided with means (not shown) to indicate a reversed input condition, such as a minus sign on a digital display. The output sequence would then be for example 00002, 00001, 00000, −00001, −00002, . . . .

The output of the counter is decoded for a zero total by 4 input AND gates 42, 44, 46, 48 and 50. It is understood that the ABCD gate inputs are connected to ABCD counter outputs respectively although the connections in FIG. 3 have been simplified for clarity by reducing the counter output lines to 1 line per counter stage. The combined output of AND gates 42-50 is low only for a zero total output of the master counter chain 1A-1E and is high for any other non-zero counter output. This combined output is connected at point 53 to one input each of 2 input NOR gates 52 and 54. The effect of a high logical state at point 53 is to block all $U_1$, $D_1$ pulses fed to the remaining inputs of gates 52 and 54.

The up pulse line $U_1$, and the down pulse line $D_1$ are derived from aforementioned conventional encoder/decoder means (not shown in the drawings) and are connected to the up/down inputs $U_2$, $D_2$ of master counter stage 1A through R-C delay networks 58-60 and also through a double pole, double throw switch which comprises digitally controlled switches 66 and 68. Exemplary of such switching devices are the COS/MOS Analog Multipliers/Demultipliers CD 4051B, CD 4052B, and CD 4053 types decribed at pages 165-172 of the 1977 RCA COS/MOS Integrated Circuit Databook, which reference is incorporated herein by this reference.

The output of the R-S flip-flop formed by cross coupled NOR gates 62 and 64, digitally controls the state of the two switches 66 and 68 which together make up the aforesaid double pole double throw switch. In one output state of the R-S flip-flop, the $U_1$, $D_1$ input pulse lines are connected straight through to the $U_2$, $D_2$ master counter inputs. In the other output state of the R-S flip-flop the switches 66, 68 are toggled such that the connection of the $U_1$, $D_1$ input lines is reversed, $U_1$ feeding the $D_2$ input and $D_1$ feeding the $U_2$ input.

The outputs of NOR gates 52 and 54 are each connected to one of the inputs of the R-S flip-flop. In an initial zero count condition NOR gates 52 and 54 are enabled for passing a $U_1$ or $D_1$ input pulse to the R-S flip-flop, the same $U_1$ or $D_1$ pulse being fed to switches 66 and 68 through R-C delay network 58 or 60.

Only the first $U_1$ or $D_1$ pulse arriving after a zero counter output is passed to the outputs of NOR gates 52, 54 because a non-zero output of the master counter 1A-1E disables these gates by means of the AND gates 42, 44, 46, 48, and 50. Thus, the switches 66 and 68 are toggled only by the first incoming $U_1$ or $D_1$ pulse following a zero counter output: as soon as the initial pulse is fed to the master counter chain 1A-1E its outputs become non-zero, and further pulses are blocked by logic gates 52 and 54. The practical effect of the digitally controlled input switching circuit of box 40 in FIG. 3 is to create a zero "bottom" for the master counter 1A-1E below which it cannot count and at which point it must reverse itself.

Up pulses are fed to one input of the R-S flip-flop, down pulses to the other. The output state of the R-S flip-flop is therefore determined by whether the first input pulse following a zero output state of the counter 1A-1E is an up pulse on line $U_1$ or a down pulse on line $D_1$.

An up pulse on line $U_1$ sets the switches 66 and 68 in the state shown in FIG. 3, the $U_1$, $D_1$ input lines being connected to the $U_2$, $D_2$ counter inputs respectively. A initial down pulse on line $D_1$, on the other hand, operates to change the output state of the R-S flip-flop which in turn toggles or alters the state of switches 66 and 68 such that input lines $U_1$, $D_1$ are connected to counter inputs $D_2$, $U_2$ respectively.

The incoming $U_1$, $D_1$ pulses are delayed by R-C networks (or other suitable delay means) to allow switches 66 and 68 to toggle to the desired state prior to passing the pulse to the counter inputs $U_2$, $D_2$.

The parallel binary outputs ABCD of the master counter chain 1A-1F may be either of binary or BCD type. The rate multiplier devices 2A-2E are commercially available as either binary or BCD types and should preferably be of the same type as the master counter stages 1A-1F. The counter stages 4A-4F may be of either the binary or the BCD type, the latter being preferred for driving a digital display by means of a BCD-to seven segment decoder driver. Preferred rate multiplier devices are the 4527 BCD type, described at pages 2-177 through 2-183 of the 1977 *National Semiconductor CMOS Databook* incorporated herein by this reference. The preferred counter devices for the master counter stages 1A-1F are the BCD CD40192B type, described at pages 358 through 363 of the 1977 *RCA COS/MOS Integrated Circuits* databook which is incorporated herein by this reference. The preferred devices for the slave counter stages 4A-4F are the 4518 type BCD devices, described at pages 2-218 through 2-222 of the 1977 *National Semiconductor CMOS Databook* which reference is incorporated herein by this reference.

It is understood that a greater or lesser number of stages may be included in the counter chains or sets and in the rate multiplier chain, depending on the desired numerical capacity of the system. The numerical conversion factor decoded by the feedback means may comprise any number of digits if the number of cascaded counter stages controlled by the feedback means is sufficiently great.

It will be apparent that the counter means for counting the serial pulses is not limited to any arbitrary number of counter stages in each counter set. While the counter means 4A-4F in FIG. 3 is shown and described as having three sets of two counter stages each, in different conversion applications each set may comprise one or more stages under feedback control. Further, the several sets need not have an equal number of counter stages.

While the invention is shown and described as a footage counter for film applications, it will be understood that many other uses exist for the method and apparatus of this invention and the associated input and output circuitry described herein.

The term "parallel binary code" includes but is not limited to the hexadecimal binary code and the Binary Coded Decimal (BCD) system.

The term "unit system" includes any system of physical units of measurement as well as pure numerical systems based on various numbers such as the decimal, hexadecimal, etc., numerical systems.

METHOD OF OPERATION OF THE INVENTION

It will be apparent from the foregoing description of the film footage counter that the method of operation of the numerical converter system of this invention comprises the following steps:

Converting a parallel binary coded input number representative of a first unit system into a number of serial pulses equal to the coded input number;

Counting the serial pulses;

Generating a carry pulse when the serial pulse count is equal to a desired numerical conversion factor;

Resetting the serial pulse count to zero prior to counting the next following serial pulse; and Counting the carry pulses to compute or derive a converted output number, the converted output number including a remainder count of serial pulses representative of the first unit system.

Where the selected second unit system comprises lesser units and greater units, such as seconds and minutes, related by a second conversion factor internal to the second unit system, and the lesser units are related to the units to the first unit system (i.e., the units represented by the parallel binary coded input number) by the aforementioned known numerical conversion factor the method of operation of this invention comprises the additional steps of:

Generating a secondary carry pulse when the aforementioned carry pulse count is equal to the internal conversion factor;

Resetting the carry pulse count to zero prior to counting the next following carry pulse; and Counting the secondary carry pulses to obtain a converted output number expressed in terms of the higher units of the second system, with a first unconverted remainder count of serial pulses, and a second remainder count of carry pulses representative of lesser units of the second unit system.

The method of this invention is also applicable to the conversion of a input number encoded in a base-a binary code to its equivalent number in a base-b binary code. The conversion is carried out by generating a number of serial digital pulses equal to the base-a binary encoded input number and then counting the serial digital pulses in the base-b system.

By way of example only, the base-a binary code may be binary coded hexadecimal and the base-b binary code may be binary coded decimal, or vice-versa. In general, both bases a and b may be any two non-equal numbers, and are not limited to the numbers 10 to 16.

Various changes and modifications within the scope of the invention will be apparent to those skilled in the art. Therefore, applicant intends to be bound only by the claims which follow.

I claim:

1. A digital counter for converting the number of film frames displaced by a bidirectional film transport mechanism to a selected one of several output formats, each format being related to said number of film frames by a numerical conversion factor, comprising:

direction sensitive master counter means receiving directionally encoded digital input pulses indicative of film displacement by said bidirectional transport for deriving a continuously updated output number indicative of the net number of frames displaced by said transport;

rate multiplier means having rate select inputs receiving as an input said updated output number and generating a cycle pulse output, each cycle comprising a number of serial output pulses equal to said input number and an inhibit pulse output;

clock means continuously driving said rate multiplier means;

slave counter means receiving said serial pulses as an input;

feedback means operative on said slave counter means for repeatedly subtracting said numerical conversion factor from the serial pulse count of said slave counter, the output count of said slave counter comprising a converted integer number equal to said total number of substractions and indicative of units of said second unit system and an unconverted serial pulse count remainder number indicative of film frames, said remainder number being lesser than said selected numerical conversion factor; and latch means clocked by said inhibit pulse output for latching the output of said counter means at the end of each said rate multiplier output cycle said inhibit pulse output being also connected for resetting said slave counter means following said latching whereby an updated converted output is latched for each rate multiplier cycle.

2. The apparatus of claim 1 wherein said slave counter means comprise a first and a second counter set, each set having a parallel binary coded word output, said first counter set receiving as an input said serial pulses and wherein said feedback means comprises gate means operatively connected to said first counter set for decoding a word output equal to said selected numerical conversion factor and thereupon feeding a carry pulse to the input of said second counter set and also to the reset inputs of said first counter set for resetting said first counter set to zero.

3. The apparatus of claim 2 wherein said second unit system comprises lesser units and greater units related by a second conversion factor intrinsic to said second unit system, and said slave counter means further comprises a third counter set having a parallel binary coded word output, and wherein said feedback means further comprises gate means operatively connected to said second counter set for decoding a word output of said second counter set equal to said intrinsic second conversion factor and thereupon feeding a secondary carry pulse to said third counter set and also to the reset input of said second counter, such that the word output of said third counter set is indicative of said greater units and the word output of said second counter set is a second remainder count indicative of said lesser units.

4. The apparatus of claim 1 wherein said slave counter means comprise a plurality of asychronously cascaded counter stages and further comprising:

latch means clocked by said inhibit pulse output for latching the output of said counter means at the end of each said rate multiplier output cycle; and means for delaying said inhibit pulse prior to clocking said latch to permit said counter stages to complete the count of said serial pulses and thereby avoid premature latching of the counter output data.

5. The counter of claim 1 wherein said rate multiplier means comprises a plurality of rate multipliers cascaded in the add mode.

6. The apparatus of claim 1, wherein said slave counter means comprises a first and a second set of one or more cascaded counter stages each set having a parallel binary coded word output, said first counter set receiving said serial pulses as an input and wherein said feedback means comprises logic gate means operatively connected to said first counter set for decoding a word output equal to said conversion factor and thereupon generating a carry pulse output, said carry pulse output being connected for resetting said first counter set and also constituting an input to said second counter set, whereby the first counter set is repeatedly reset each time the count of said serial pulses equals said conversion factor until all of said number of serial digital pulses have been counted by said first counter set, at which time the word output of said second counter set is the total count of said carry pulses and the word output of said first counter set is a remainder count of said serial pulses.

7. The apparatus of claim 3 or claim 6 wherein said logic gate means are connected for decoding a plurality of preselected counter output words each equal to one of a plurality of numerical conversion factors, said logic gate means further comprising:
- a plurality of independent carry pulse outputs each corresponding to one of said numerical conversion factors; and
- switch means for selecting one of said plurality of independent carry pulse outputs whereby said parallel binary coded input number may be divided by a selected one of said plurality of conversion factors.

8. The apparatus of claim 1 wherein said slave counter means comprises a plurality of asynchronously cascaded counter stages and further comprising:
- latch means clocked by said inhibit pulse output for latching the output of said counter means at the end of each said rate multiplier output cycle; and
- means for delaying said inhibit pulse prior to clocking said latch and clearing said counter stages to permit said counter stages to complete the count of said serial pulses and thereby avoid premature latching of the counter output data.

9. The apparatus of claim 1 further comprising means for synchronizing said inhibit pulse to said clock means.

10. The apparatus of claim 1 wherein said feedback means further comprises switch means for selecting one of a plurality of said numerical conversion factors.

11. The apparatus of claim 1 further comprising digital display means connected for displaying said latched slave counter output.

* * * * *